(12) United States Patent
Chang (10) Patent No.: US 10,587,285 B1
(45) Date of Patent: Mar. 10, 2020

(54) HARDWARE FRIENDLY DATA COMPRESSION

(71) Applicant: Nyquist Semiconductor Limited, Grand Cayman (KY)

(72) Inventor: Yuan-mao Chang, Hsinchu (TW)

(73) Assignee: Nyquist Semiconductor Limited, Grand Cayman (KY)

( * ) Notice: Subject to any disclaimer, the term of this patent is extended or adjusted under 35 U.S.C. 154(b) by 0 days.

(21) Appl. No.: 16/591,737

(22) Filed: Oct. 3, 2019

Related U.S. Application Data (63) Continuation of application No. 16/211,313, filed on Dec. 6, 2018, now Pat. No. 10,476,518.

(51) Int. Cl.
*H03M 7/30* (2006.01)
*G06F 16/22* (2019.01)

(52) U.S. Cl.
CPC ...... *H03M 7/3088* (2013.01); *G06F 16/2255* (2019.01); *H03M 7/6005* (2013.01); *H03M 7/6011* (2013.01)

(58) Field of Classification Search
CPC ............. H03M 7/3088; H03M 7/6011; H03M 7/6005; G06F 16/2255
USPC .................................... 341/51, 67, 106, 107
See application file for complete search history.

(56) References Cited

U.S. PATENT DOCUMENTS

| 10,380,781 | B2 * | 8/2019 | Yang | ........................ G06T 9/00 |
| 10,411,727 | B1 * | 9/2019 | Lan | .................... H03M 13/1117 |
| 10,454,498 | B1 * | 10/2019 | Mao | .................... H03M 7/6029 |
| 10,462,495 | B2 * | 10/2019 | Hachfeld | ............... H04N 19/93 |

\* cited by examiner

*Primary Examiner* — Brian K Young
(74) *Attorney, Agent, or Firm* — IPro, PLLC; Xiaomin Huang (57) ABSTRACT

Systems, apparatus and methods are provided for compressing data. An exemplary method may comprise interleaving one or more literal length fields with one or more literal fields to an output. The literal fields may contain a first data segment literally copied to the output, and each of the one or more literal length fields may contain a value representing a length of a succeeding literal field. The method may further comprise determining a second data segment being matched to a previously literally copied sequence of data and a match position and writing to the output one or more match length fields and a match position field containing the match position. The literal length fields may contain a total length of the first data segment and the match length fields may contain a total length of the second data segment.

20 Claims, 4 Drawing Sheets

HARDWARE FRIENDLY DATA COMPRESSION

TECHNICAL FIELD

The disclosure herein relates to data compression, particularly relates to lossless compression.

BACKGROUND

Data compression has been widely used in digital signal systems, such as communication and computing systems. For example, to save storage space or transmission time, it is common to compress computer data into TAR or ZIP file formats. Over the years, a family of compression schemes have been developed based on the compression techniques originally published by Abraham Lempel and Jacob Ziv in 1977 and 1978, which have been referred to as LZ77 and LZ78. Some of the LZ family compression schemes favor compression ratio over speed while some others sacrifice speed for a higher compression ratio. These various LZ compression techniques, however, are developed for a general-purpose computing system that normally uses a general purpose Central Processing Unit (CPU) to perform the data compression or decompression operations. Therefore, there is a need for a compression technique that is more hardware friendly, for example, suitable for a Field Programmable Gate Array (FPGA) or an application specific integrated circuit (ASIC).

SUMMARY

The present disclosure provides systems and methods for a lossless compression. The compressed data may include two types of data: literals and matched. Literals may refer to data that may be literally copied from input to output. Matched may refer to data that match to a previously copied literal and thus may be replaced with a referent to the previous copy. In an embodiment, a compressed data block may comprise one or more literal length fields interleaved with one or more literal fields, one or more match length fields with a match position field inserted after an initial match length field, and zero or more repeat length fields.

An exemplary compression process may generate one or more literal length fields interleaved with one or more literal fields such that data to be literally copied may be output as soon as one literal length field and one literal field may be filled up. Once a match is found for a data snippet of a minimum match size, one or more match length fields may be generated and a match position may be located and inserted into a match position field after an initial match length field. The compression process may further determine whether the matched data segment is repeated and record a number of how many times the matched data segment is repeated. Therefore, the repeat length fields may in combination contain a total value representing how many times a matched data segment may be repeated.

In an exemplary embodiment, there is provided a method for generating compressed data. The method may comprise: interleaving one or more literal length fields with one or more literal fields to an output, each of the one or more literal fields containing a part of a first data segment literally copied from an input stream of data to the output, and each of the one or more literal length fields containing a value representing a length of a succeeding literal field, the one or more literal length fields in combination containing a first total value representing a total length of the first data segment; determining a second data segment of the input stream of data being matched to a previously literally copied sequence of data and a match position; and writing to the output one or more match length fields and a match position field containing a value representing the match position, the one or more match length fields in combination containing a second total value representing a total length of the second data segment.

In another exemplary embodiment, there is provided an apparatus comprising an encoder. The encoder may comprise a data packager to generate one or more data snippets from an input stream of data, each of the one or more data snippets having a length of a minimum match length; a hash calculator to generate a hash value for each of the one or more data snippets; a hash table to keep track of the one or more data snippets using their respective hash values; a match position searcher to search whether a data snippet has a match in already processed data based on entries in the hash table; a match position merger to merge two or more data snippets having found match in already processed data; and an output assembler. The output assembler may be configured to interleave one or more literal length fields with one or more literal fields to an output, each of the one or more literal fields containing a part of a first data segment literally copied from the input stream of data to the output, and each of the one or more literal length fields containing a value representing a length of a succeeding literal field, the one or more literal length fields in combination containing a first total value representing a total length of the first data segment; determine a second data segment of the input stream of data being matched to a previously literally copied sequence of data and a match position; and write to the output one or more match length fields and a match position field containing a value representing the match position, the one or more match length fields in combination containing a second total value representing a total length of the second data segment.

In yet another exemplary embodiment, disclosed herein may also include a non-transitory machine-readable medium having executable instructions, wherein the executable instructions, when executed by a computing system, causes the computing system to: interleave one or more literal length fields with one or more literal fields to an output, each of the one or more literal fields containing a part of a first data segment literally copied from an input stream of data to the output, and each of the one or more literal length fields containing a value representing a length of a succeeding literal field, the one or more literal length fields in combination containing a first total value representing a total length of the first data segment; determine a second data segment of the input stream of data being matched to a previously literally copied sequence of data and a match position; and write to the output one or more match length fields and a match position field containing a value representing the match position, the one or more match length fields in combination containing a second total value representing a total length of the second data segment.

DETAILED DESCRIPTION

Specific embodiments according to the present disclosure will now be described in detail with reference to the accompanying figures. Like elements in the various figures are denoted by like reference numerals for consistency.

The present disclosure provides systems and methods for a lossless compression. The compressed data may include two types of data: literal and matched. Literal may refer to data that may be literally copied from input. Matched may refer to data that match to previously copied literal and thus may be replaced with a referent to the previous copy. In an embodiment, a compressed data block may comprise one or more literal length fields interleaved with one or more literal fields, one or more match length fields with a match position field inserted after an initial match length field, and zero or more repeat length fields.

An exemplary compression process may generate one or more literal length fields interleaved with one or more literal fields such that data to be literally copied may be output as soon as one literal length field reaches its maximum and the corresponding literal field fills up. Once a match is found for a data snippet of a minimum match size, one or more match length fields may be generated, and a match position may be located and inserted into a match position field after an initial match length field. The compression process may further determine whether the matched data segment is repeated and record a number of how many times the matched data segment is repeated. Therefore, the repeat length fields may in combination contain a total value representing how many times a matched data segment may be repeated.

Figure 1:
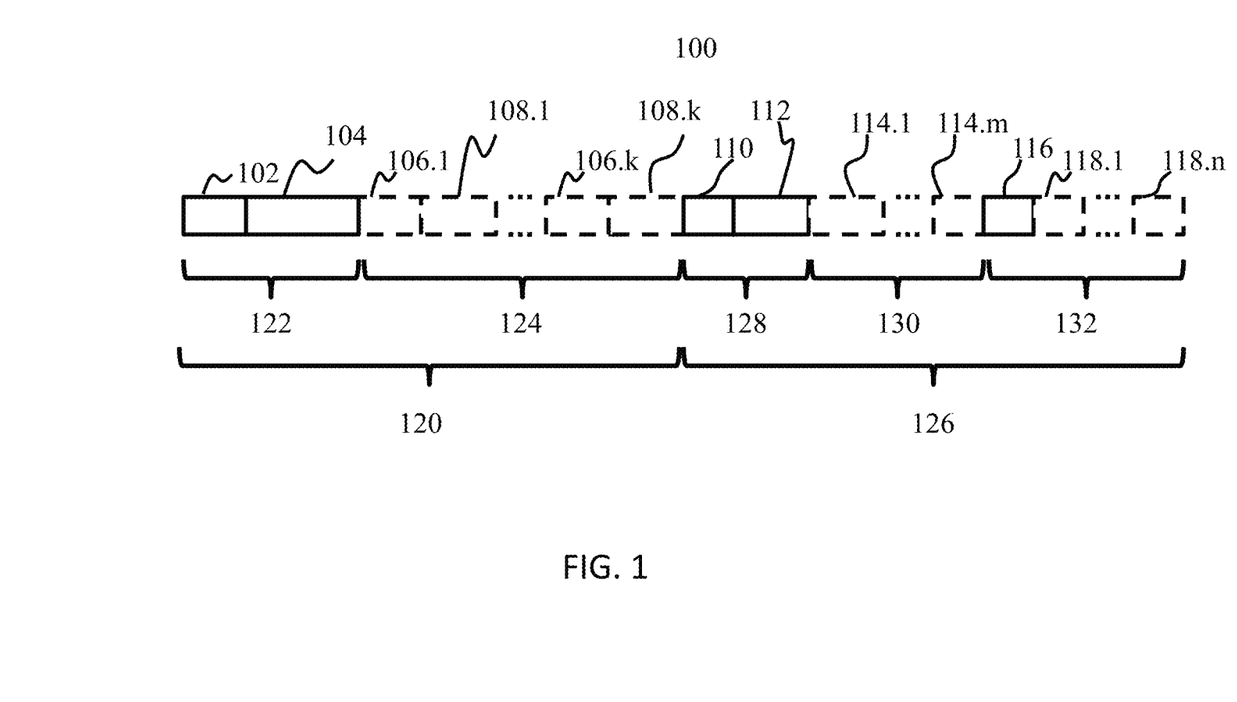
FIG. 1 schematically shows a compressed data block in accordance with an embodiment of the present disclosure.

FIG. 1 schematically shows a compression format in accordance with an embodiment of the present disclosure. The compression format may be represented in a compressed data block 100, which may be a compressed data unit generated by a compression process. The compressed data block 100 may comprise a first segment 120 for a snippet of data literally copied from an input stream of data and a second segment 126 for a matched snippet of data. The first segment 120 may be referred to as a literal segment of the compressed data block 100 and the second segment 126 may be referred to as a matched segment of the compressed data block 100. In some embodiments, the data to be compressed may be processed as a stream of bytes with each byte being eight bits. Thus, the literal segment 120 may contain a string of bytes copied from an input data stream and length of the string to be literally copied. The matched segment 126 may include information regarding a string of bytes that may be matched from previously processed data such that the string of bytes need not be literally copied again. It should be noted that using byte as a data unit for compression is just an example, various embodiments may implement the technique disclosed herein for other suitable size of data unit (e.g., 4 bits, 16 bits, 24 bits, 32 bits, or 64 bits).

In some embodiments, the data snippet to be searched and matched may have a minimum match length. That is, for a sequence of bytes less than the minimum match length, no matching operation need to be performed. The minimum match length may be denoted as min-match. A typical min-match may be four (4), although other numbers may be used in some embodiments. For illustration purpose, the examples in the present disclosure may use four as an example for min-match.

The first segment 120 may be referred to as a literal section and may comprise an initial literal section 122 and an extended literal section 124. The initial literal section 122 may comprise an initial literal length field 102 and an initial literal field 104. The initial literal length field 102 may store a value referred to as an initial literal length. The initial literal length field 102 may have a fixed width in bits and the fixed width may determine the maximum value of the initial literal length and the size of the initial literal field 104. The fixed width may be a number of bits with the number being a positive integer, which may be 2 but typically more than 2, for example, 3, 4, 5, etc. For illustration purpose, the initial literal length field 102 in the present disclosure may use 3 bits as an example, and thus the initial literal length may range from 0 (all three bits being zero) to 7 (all three bits being one). If the initial literal length is 0, no data is literally copied from the input data stream and the initial literal field 104 may be empty. In one embodiment, the initial literal field 104 may not exist in a compressed data block 100 when the initial literal length is zero ("000" in binary).

If the initial literal length is a number "x" that may be larger than 0 (e.g., x may be 1, 2, 3, 4, 5, 6, or 7), the initial literal field 104 may have a width of "x" bytes and contain "x" bytes of data literally copied from the input data stream. When the initial literal length is less than 7, the extended literal section 124 may not be needed. Therefore, in one embodiment, a compressed data block 100 may not have the extended literal section 124 when the value in the initial literal length field 102 is less than 7. For example, if the string of bytes to be literally copied from a stream of data may be five bytes denoted as "ABCDE", the literal segment 120 may consist of an initial literal length field 102 with a value of "101" (e.g., binary for number 5) and an initial literal field 104 of five bytes "ABCDE". Because there are no more literal data to be copied from the input stream, the literal segment 120 in this example does not have any extended literal length field 106 or extended literal field 108. Please note that the string of bytes in the examples of the present disclosure may be any data and not necessarily characters. The character notation, for example, "ABCDE" and any other exemplary strings, may be used to denote different values of bytes in a stream of data.

The extended literal section 124 may comprise extended literal length fields 106.1 through 106.k and extended literal fields 108.1 through 108.k. The extended literal length fields 106.1 through 106.k may each also have a fixed width in bits. In some embodiments, each of the extended literal length fields 106.1 through 106.k may have an equal fixed width. In some other embodiments, at least one of the extended literal length fields 106.1 through 106.k may have a fixed width that may be different from others. Moreover, in an embodiment, the fixed width of the extended literal length fields 106.1 through 106.k may be equal to the fixed width of the initial literal length field 102. But, in some other embodiments, the fixed width of the extended literal length fields 106.1 through 106.k may be different from the fixed width of the initial literal length field 102. Exemplary fixed width of the extended literal length fields 106.1 through 106.k may be 8 bits, 16 bits, etc. For illustration purpose, the present disclosure may use 4 bits as an example for the extended literal length field 106.1 through 106.k. and thus the value in any extended literal length field 106.1 through 106.k may range from 0 (all four bits being zero) to 15 (all four bits being one).

When all bits of the initial literal length field 102 are one, the initial literal length may be 7 (binary "111" for 3 bits) and at least the first extended literal length fields 106.1 of the extended literal section 124 may be needed. The extended literal length field 106.1 and extended literal field 108.1 may function similarly to the initial literal length field 102 and the initial literal field 104 in that the value in the extended literal length field 106.1 may indicate how many bytes may be contained in the extended literal field 108.1 and the next extended literal length field 106.2 (and possibly the next extended literal field 108.2) may be needed when all bits of the extended literal length field 106.1 reach one. When the extended literal length field 106.1 is zero, the extended literal field 108.1 may be empty. Thus, in an embodiment, the extended field 108.1 may not exist when the value of the extended literal length field 106.1 is zero. For example, the string of bytes to be literally copied from a stream of data may be seven bytes denoted as "ABCDEFG", the literal segment 120 may consist of an initial literal length field 102 of 3 bits of one ("111"), an initial literal field 104 of seven bytes "ABCDEFG" and an extended literal length field 106.1 of 4 bits of zero ("0000"). Because there are no more literal data to be copied from the input stream. The literal segment 120 in this example does not have any extended literal field 108 or any more extended literal length field 106 (other than the extended literal length field 106.1).

When the extended literal length field 106.1 is larger than zero, the extended literal field 108.1 may be needed. For example, the string of bytes to be literally copied from a stream of data may be 8 bytes denoted as "ABCDEFGH", the literal segment 120 may consist of an initial literal length field 102 of 3 bits of one ("111"), an initial literal field 104 of 10 bytes "ABCDEFG", an extended literal length field 106.1 of 3 bits of zero and one bit of one ("0001") and an extended literal field 108.1 of one byte "H". The literal segment 120 in this example does not have any more extended literal length field 106 (other than the extended literal length field 106.1) or any more extended literal field 108 (other than the extended literal field 108.1).

When all bits of extended literal length field 106.1 reach one, for example, binary "1111" for all four bits and a value of 15, the extended literal length field 106.2 may be needed, and the extended literal field 108.2 may contain the next section of the string of bytes to be copied from the input data stream. The extended literal length field 106.1 through 106.k and its companion extended literal field 108.1 through 108.k may thus be added one by one after a preceding literal field may be filled and all bits of the preceding literal length field reach ones. That is, the extended literal length field 106.k exists only when all bits of the preceding extended length field 106.k−1 are ones. The number k may denote a total number of extended literal fields may be added after the initial literal field 104. In some embodiments, the number of bits in the literal length field and/or extended literal length field may be determined by hardware limitation, such as, but not limited to, the size of memory allocated for the compression operation, the cache size of the microprocessor, etc.

The second segment 126 may comprise an initial match section 128, an extended match length section 130 and a repeat match section 132. The initial match section 128 and the extended match length section 130 may be collectively referred to as a match section, and the repeat match section 132 may be simply referred to as a repeat section. The initial match section 128 may comprise an initial match length field 110 and a match position field 112. The initial match length field 110 may have a fixed width in bits to indicate how long a sequence of bytes may be matched in previously processed data. Exemplary fixed width for the initial match length field 110 may be 2 bits, 3 bits, 4 bits, 5 bits or any suitable integer of bits. For illustration purpose, the examples in the present disclosure may use 3 bits as an example for the initial match length field 110. The match position field 112 may contain the position value indicating where the matched sequence of bytes may be located. In an embodiment, the position value may be an absolute index from a beginning of the stream of input data. A large file may be divided into blocks, for example, 4 KB blocks and each block may be referred to an input stream during processing. In another embodiment, the position value may be an offset counting from the current position in the stream of input data towards already processed data. For example, if the position value is a number "y" as an offset, the matched string of bytes may start from the current position counting backwards y bytes. Exemplary width of the match position field 112 may be 8 bits, 10 bits, 12 bits or any suitable value of bits. For illustration purpose, the examples in the present disclosure may use 12 bits as an example for the match position field 112.

The extended match length section 130 may comprise one or more extended match length fields 114.1 through 114.m. Each of the extended match length fields 114.1 through 114.m may have a fixed width in bits. The fixed widths of the extended match length fields 114.1 through 114.m may be equal in some embodiments and different in some other embodiments. Exemplary fixed width for the extended match length field 114.1 through 114.m may be 2 bits, 3 bits, 4 bits, 5 bits or any suitable value of bits. For illustration purpose, the examples in the present disclosure may use 8 bits as an example for the extended match length fields 114.1 through 114.m. When the length of the matched sequence of bytes reaches the maximum value of the initial match length field 110 (e.g., all bits being ones), the first extended match length field 114.1 may be used. And when the length of the matched sequence of bytes reaches the total of maximum value contained in both the initial match length field 110 (e.g., all bits being ones) and the first extended match length field 114.1 (e.g., all bits being ones), the next extended match length field 114.2 may be used. Thus, the extended match length field 114.m may be used only when all bits in the preceding match length fields (e.g., the initial match length field 110 and the extended match length field 114.1 through extended match length field 114.m−1) are ones.

In an embodiment, because a match is at least for a sequence of min-match length, the actual match length of sequence of bytes may be the total value contained in the initial match length field 110 and all extended match length fields 114 plus min-match and minus one (e.g., actual match length=total value+min-match−1). For example: when the actual match length of sequence of bytes is 4, the value in the initial match length field 110 may be one (1); when the actual match length of sequence of bytes is 6, the value in the initial match length field 110 may be three (3); when the actual match length of sequence of bytes is 15, the value in the initial match length field 110 may be seven (7) (e.g., binary "111") and the value in the extended match length field 114.1 may be five (5) (e.g., binary "00000101"); and so on.

For example, the input stream of data may be "ABCDEFGHIJKABCDE". In an embodiment, the first 11 bytes "ABCDEFGHIJK" may be broken into two pieces "ABCDEFG" and "HIJK" with the first piece of "ABCDEFG" copied to the initial literal field 104 and the second piece of "HIJK" copied to the extended literal field 108.1. The initial literal length field 102 may contain three bits of ones (e.g., "111"). The extended literal length field 106.1 may contain a value of 4 (e.g., "0100"). The next five bytes of "ABCDE" may be a matched sequence of the first five bytes. Considering the min-match, the initial match length field 110 may contain a value of 2 (e.g., binary "010"). In an embodiment using absolute index as match position, the match position field 112 may contain a value of zero (for the case of indexing from zero) or one (for the case of indexing from one). In an embodiment using offset as match position, the match position field 112 may contain a value of eleven (11) because the matched sequence starts by counting eleven bytes from the current position.

The repeat match section 132 may comprise an initial repeat length field 116 and extended repeat length fields 118.1 through 118.n. The matched data may keep repeating to form a repeat pattern. The initial repeat length field 116 may have a fixed width equal to or larger than one, for example, 1 bit, 2 bits, 3 bits, and so on. The initial repeat length field 116 and the extended repeat length fields 118.1 through 118.n may contain values to indicate the numbers of the repetition. Each of the repeat length fields 118.1 through 118.n may have a fixed width in bits. The fixed widths of the repeat length fields 118.1 through 118.n may be equal in some embodiments and different in some other embodiments. Exemplary width for the repeat length fields 118.1 through 118.n may be 2 bits, 3 bits, 4 bits or any suitable number of bits. For illustration purpose, the initial repeat length 116 and the extended repeat length fields 118.1 through 118.n in the present disclosure may use 2 bits as an example. Similar to the extended literal length fields and extended match length fields, the extended repeat length fields 118.2 through 118.n may be used only when all bits in the preceding repeat length fields are ones.

For example, the data to be compressed may be 100 bytes of repeated zeros. With the min-match being four, the first four bytes of zeros may be copied as a string of zeros to the initial literal field 104. The next four bytes of zeros may be a matched sequence of four bytes of zeros. The second four bytes of matched zeros (third four bytes of zeros in this 100 bytes of zeros) and all following four bytes of matched zeros may form a repeat pattern with 23 times of repetitions. In this example, the initial repeat length field 116 may have a value of three (e.g., binary "11", the extended repeat length fields 118.1 through 118.6 may contain a value of three (e.g., binary "11"), and the extended repeat length field 118.8 may contain a value of 2 (e.g., binary "10").

The "repeat pattern" matching may be used to mitigate the problem of overlapping match in the conventional LZ family of compression algorithms. In an embodiment, it may be assumed that long repeat pattern rarely exists, and thus, the repeat match section 132 may exist only when the value of the initial match length field 110 is less than its maximum (e.g., less than all ones). Considering the min-match, for the example of the width of the initial match length field 110 being 3 bits and the maximum is 7, this may effectively put the maximum length of a sequence for a repeat pattern to be 9 bytes (e.g., 6+min-batch−1). In other words, in this embodiment, the repeat field 116 and the first extended match length field 114.1 may be mutually exclusive.

Figure 2:
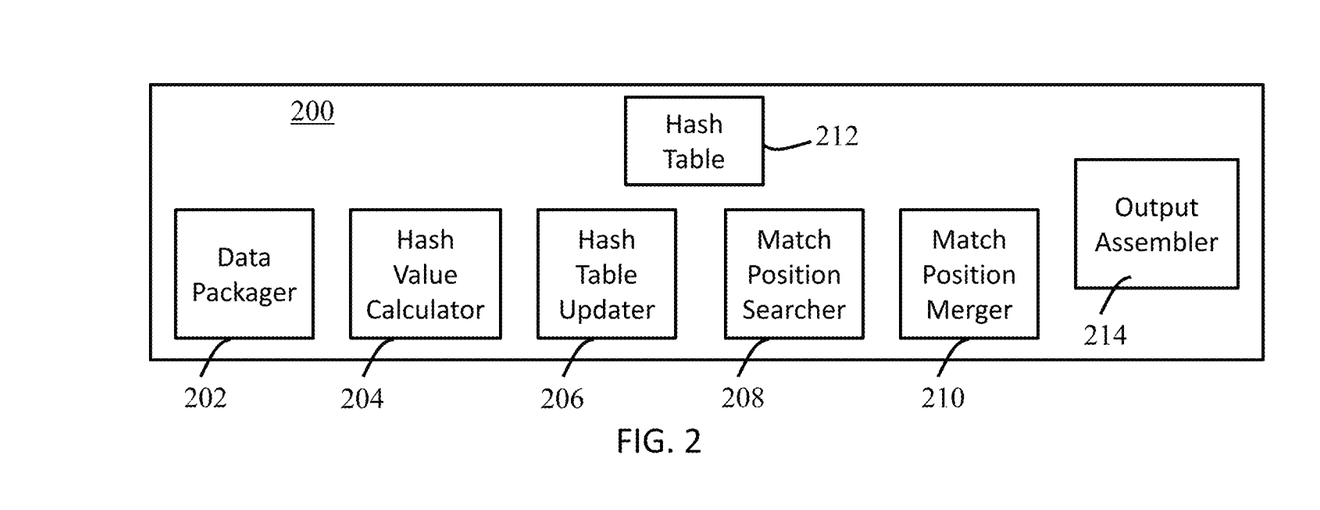
FIG. 2 schematically shows an encoder in accordance with an embodiment of the present disclosure.

The compressed data block 100 may be generated by a variety of implementations in different embodiments. FIG. 2 schematically shows an encoder 200 in accordance with an embodiment of the present disclosure. The encoder 200 may be configured to receive a stream of input data and generate compressed data blocks for the input data and thus may be referred to as a compressor or compression engine. The encoder 200 may comprise a data packager 202, a hash value calculator 204, a hash table updater 206, a hash table 212, a match position searcher 208, and a match position merger 210. The data packager 202 may receive an input stream of data and process the received data by generating short sequences of data snippets. Each data snippet may comprise min-match bytes. The first data snippet may start at a starting byte of the data stream, and all other data snippets may start at a second byte of a preceding data snippet. For example, a stream of data "ABCDEFG" may be packaged into 4-byte sequence of data snippet of "ABCD", "BCDE", "CDEF" and "DEFG". In some embodiments, the data to be compressed may optionally be divided into blocks, for example, 4K bytes (4 KB) blocks. And the position information may be a position within one block. For example, an absolute index may be the position from beginning of the block. In an embodiment that data is processed in blocks, each data snippet may start at a second byte of a preceding data snippet except the first data snippet, which may start at a starting byte of the current block.

The data packager 202 may have a data process bandwidth that determines how many data snippets may be packaged in one batch. For example, if the bandwidth may be four, the data packager 202 may package four 4-byte data snippets in one batch. Thus, a sequence of data "ABCDEF-GHABCDE" may be packaged into "ABCD", "BCDE", "CDEF" and "DEFG" in the first four 4-byte sequences and output from the data packager 202 if the data packager 202 has a data process bandwidth of 4. The next four 4-bypte sequences "EFGH", "FGHA", "GHAB" and "HABC" may be packaged in the data packager 202 and output from the data packager 202 in a second batch. In another embodiment, the data packager 202 may have a data process bandwidth of 8 and the 8 4-bytes sequences may be generated and output from the data packager 202 in one batch.

The hash value calculator 204 may be configured to generate hash values for short sequences generated by the data packager 202. For example, if there are four short sequences generated by the data packager 202 and sent to the hash value calculator 202 in one batch, the hash value calculator 204 may generated 4 hash values in one batch that each hash value may be generated for one short sequence of data snippet respectively. The 4-byte sequence used to generate a hash value may also be referred to as the 4-byte sequence corresponding to the hash value.

The hash values generated by the hash value calculator 204 may be transmitted to the hash table updater 206, where previously processed hash values and their corresponding 4-byte sequence of data snippets (and positions) may be tracked in the hash table 212. The hash table 212 may be implemented in a suitable data structure, such as but not limited to, a dictionary, in which the hash values may be used to as indices for entries in the dictionary. Each entry pointed to by an index may have one field for storing the corresponding 4-byte sequence and another field for storing a position. In an embodiment, the position may be an absolute index of the corresponding 4-byte sequence in the 4K bytes block currently being processed, starting for example, with the first byte in the 4 K bytes block as 0 (for 0 indexed positioning) or 1 (for 1 indexed positioning).

In some embodiments, when multiple hash values and their corresponding 4-byte sequences are received from the hash value calculator 204, the hash values may be processed by the hash table updater 206 in the order of the corresponding 4-byte sequences' positions in the stream of input. For example, the first four 4-byte sequences of the input stream of data "ABCDEFGHABCDE" may be "ABCD", "BCDE", "CDEF" and "DEFG", and the 4-byte sequence "ABCD" may be processed first, then "BCDE" second, "CDEF" third and "DEFG" afterwards.

If the hash table 212 has no entry pointed to by the hash value newly received by the hash table updater 206, the hash table updater 206 may try to update the hash table 212 with the newly received hash value as an index for a new entry to store the corresponding 4-byte sequence and position of the 4-byte sequence in the data stream. In some embodiments, if there is no space for a new entry, an existing entry may be cleared and a new entry may take the cleared entry's space. In an embodiment, the existing entry may be chosen using a cache replacement algorithm, such as, but not limited to, Least Recently Used (LRU).

If the hash table 212 already has an entry pointed to by the newly received hash value, it may be a match or a hash value collision. A match may mean that the 4 bytes sequence corresponding to the newly received hash value is in already processed data and found. That is, the 4 bytes sequence has already been copied into the output in a literal string and its position is in the hash table. A hash value collision may mean the 4 bytes sequence corresponding to the newly received hash value is not in already processed data, but the already processed data has another 4 bytes sequence that has a hash value that equals to the newly received hash value.

If a newly received hash value is an existing index for an entry of the hash table, the match position searcher 208 may compare the 4-byte sequence corresponding to the newly received hash value to the 4-byte sequence stored in the hash table entry pointed to by the index. If the two 4-byte sequences are equal, then there is a match and the 4-byte sequence and the position stored in the entry may be passed on to the match position merger 210.

If the two 4-byte sequences are different, then it is a hash conflict and a conflict resolution technique may be used. The conflict resolution technique may be one of those known in the art or any future developed suitable technique. For example, one way to deal with hash conflict is by adding another entry in the hash table so that one index may point to two or more entries in the hash table and each time when a newly received hash value is an existing index, each 4-byte sequences in the entries pointed to by the index may be checked to determine whether there is a match or a hash conflict.

In one embodiment, the match position searcher 208 may receive the 4 bytes sequence used to generate the hash value and a fixed width (e.g., 12 bits) that represent a length of a window (e.g., current 4 KB data block) for searching the match position in the window.

The match position merger 210 may be configured to generate match length and match position information. In some embodiments, the match position merger 210 may be configured to determine whether there may be multiple matched 4-byte sequences with their positions obtained from the hash table in a successive order and determine whether the matched length may be the length of a single matched sequence of data. For example, if two consecutive 4-byte sequences "ABCD" and "BCDE" are both matched, the match position merger 210 may be configured to merge these two sequences into one matched sequence of "ABCDE" with a matched length of 5 bytes and the match position is the position of the matched sequence "ABCD". In an embodiment, the position of a matched sequence may be obtained directly from the hash table entry, which may be an absolute index of the matched sequence in the input stream of data, and the absolute index of the matched sequence may be put in the match position field as the match position. In another embodiment, the value to be put in the match position field as the match position may be an offset obtained by minus the absolute index from the value of current position.

In some embodiments that the hash table 212 may have a limited size, not all previously processed hash values and their corresponding 4-byte sequences may be saved in the hash table 212. Therefore, there may be missed matches in the hash values and corresponding 4-byte sequences. In an embodiment, the match position merger 210 may be configured to recover missed matched patterns if the missed matched pattern is located in the input stream between two matched sequences separated by an index distance up to min-match. When the index difference is equal to the difference of the two match positions, and the difference is min-match or less, all sequences between the two consecutive matches may be merged together into one matched sequence.

For example, if five consecutive sequences "ABCD", "BCDE", "CDEF", "DEFG", "EFGH" and their hash values are being processed, and the string "ABCDEFGH" is in the already processed data, then in an ideal situation, all five sequences should be tracked in the hash table 212 and matched. But because of the size limit, the hash table 212 may have entries for "ABCD" and "EFGH", and no entries for "BCDE", "CDEF" or "DEFG", assuming the matched sequence "ABCD" has an absolute index of "N" stored in the hash table, then the matched sequence "EFGH" may have an absolute index of "N+4" stored in the hash table. The index distance between "EFGH" and "ABCD" is 4 and equals to the difference between matched sequences, and the index difference is the min-match, and thus satisfies the condition of min-match or less. In this case, the match position merger 210 may determine that the matched pattern is "ABCDEFGH" with a match length of eight ("8") and the match position is the position for the sequence of "ABCD" (e.g. "N" or an offset of current index minus N).

In another example, suppose the sequence of "ABCD-EDEFG" is in the processed data and "ABCD", "BCDE" and "DEFG" are in the hash table with position values of L, L+1 and L+5, and L may be an index value larger than or equal to zero. Assuming now that another sequence of "ABCDEFG" is being packaged into "ABCD" with position value of M, "BCDE" with position value of M+1, "CDEF" with position value of M+2 and "DEFG" with position value of M+3. The 4-byte sequence "ABCD", "BCDE" and "DEFG" may be matched to the corresponding hash table entries. The "BCDE" and "DEFG" are consecutive matches, but the difference in the matched position values is 4 and the index difference is 2, and thus, the sequences between "BCDE" and "DEFG" in the sequence "ABCDEFG" are not missed matches and these two sequences cannot be combined into one matched sequence.

Therefore, in an embodiment, the match position merger 210 may check the index distance and match position difference between two consecutive matches before determining the match length and the match position.

In one embodiment, the match position merger 210 may receive the 4 bytes sequence corresponding to the hash value and a fixed width (e.g., 12 bits) that represent a length of a window for merging the matched sequences within the window.

The output assembler 214 may be configured to generate compressed data blocks for the input stream of data by first interleaving one or more literal length fields with one or more literal fields. Each of the one or more literal fields may contain a part of a first data segment literally copied from an input stream to the output, and each of the one or more literal length fields may contain a value representing a length of a succeeding literal field. The one or more literal length fields in combination may contain a total value representing a total length of the first data segment.

The output assembler 214 may also be configured to handle any repeat patterns. If there are any successive matched sequences with the same match position and match length, a repeat pattern may be detected and the output assembler 214 may generate the initial repeat length field 116 and any extended repeat length fields 118 with the total value in these fields representing the number of repetitions.

In an embodiment, all 4-byte sequences of data snippets may be passed to the output assembler 214 regardless of whether any of the sequences may have been matched to previously processed data or determined to be missed matches that can be recovered. When a sequence has no match in previously processed data and cannot be recovered as a missed match, it may be determined that the first byte in the 4-byte sequence need to be literally copied to a compressed data block. For example, if "ABCD" has no match and cannot be recovered as a missed match, "A" may be literally copied to a compressed data block because "BCD" may be the first three bytes of a next 4-byte sequence "BCDE", which may be matched to a previously processed data snippet. If "BCDE" has no match and cannot be recovered as a missed match, "B" may be literally copied to a compressed data block. When the number of bytes to be literally copied reached the maximum that can be represented by the initial literal length (e.g., 7), the initial literal length field 102 may be complete and the initial literal field 104 may be filed with the maximum number of bytes represented by the initial literal length, and any subsequent bytes may be filled to one or more extended literal fields up to a maximum dictated by each corresponding extended literal length field.

This interleaving of one or more literal length fields with one or more literal fields may be completed when one or more 4-byte sequence of data snippets may be matched. The match position merger 210 may pass the match position (e.g., absolute index or offset) and match length to the output assembler 214. The output assembler 214 may write one or more match length fields and a match position field containing the match position to the output. The one or more match length fields in combination may contain a total value representing a total length of the matched data segment.

In an embodiment, the literal length fields, literal fields, match length fields, position field, repeat field and repeat length fields may be generated and output on the fly as soon as the data reaches the output assembler 214. Therefore, there is no need to wait for a whole compressed data block to be assembled before compressed data may be output from the encoder 200.

Figure 3:
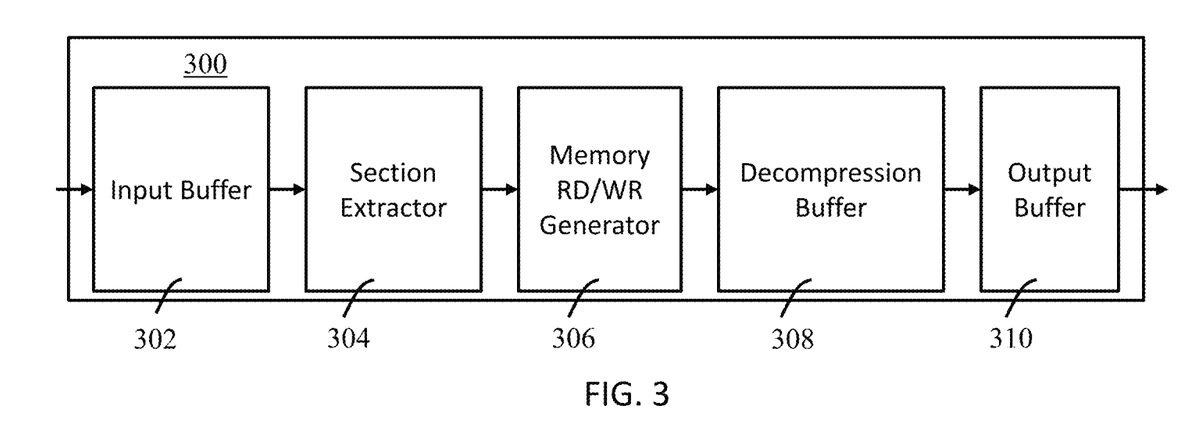
FIG. 3 schematically shows a decoder in accordance with an embodiment of the present disclosure.

FIG. 3 schematically shows a decoder 300 in accordance with an embodiment of the present disclosure. The decoder 300 may comprise an input buffer 302, a section extractor 304, a memory command generator 306, a decompression buffer 308 and an output buffer 310. An input stream of compressed data may be processed by the decoder 300 to generate decompressed data. The decoder 300 may receive the compressed data blocks at the input buffer 302. In an embodiment, the input buffer 302 may have a fixed width to facilitate subsequent processing. For example, if the min-match is 4, the input buffer may have an 8 bytes width such that 8 bytes may be temporarily stored therein. Two 8 bytes may be combined into 16 bytes to be input to the section extractor 304.

At the section extractor 304, the literal section, match section and repeat section may be extracted from the input compressed data. For example, based on the format of the compressed data block 100. The section extractor 304 may be configured to read the content of input data, distinguish the different sections and separate the literal section, match section and repeat section. The separated literal section, match section and repeat section may be passed on to the memory command generator 306.

At the memory command generator 306, read and write commands may be generated.

For example, from the extracted literal section, a literal string may be generated by combining the literal string in the initial literal field and all extended literal fields if there is any. The memory command generator 306 may generate one or more write commands to write this literal string to the decompression buffer 308. The decompression buffer 308 may send the literal string to the output buffer 310 and also keep a copy of the literal string. From the extracted match section, the match position may be obtained, and match length may be determined by combining the values in the initial match length field and all extended match length fields if there is any, and a read command may be issued by the memory command generator 306 to read the matched sequence of bytes of the match length from already decompressed data at the match position and write the matched sequence of bytes to the decompression buffer 308. And from the repeat section if there is any, the number of repetitions may be determined by combining the values of all repeat length fields and the repeated sequence of data may reconstructed in the decompression buffer 308. In an embodiment, the decompressed data reconstructed from the match section and repeat section may be sent to the output buffer 310.

In one embodiment, the decompression buffer 308 may comprise a decompression cache and a decompression memory. The decompression memory may be used as a storage for keeping already processed data such that matched patterns may be obtained from the already processed data. The decompression cache may be used as a temporary storage for the literal string before the literal string is sent to the output buffer 310 and also used as a working cache to assemble the matched and repeat pattern obtained from the decompression memory before any matched pattern and repeat pattern may be restored to the decompressed (or pre-compression) format. In an embodiment, the input to the output buffer 310 may have a width that matches a width of a data bus coupled to the decoder 300.

In some embodiments, the throughput of a decoder may be limited by the bandwidth of decompression memory. For example, the decompression memory may be implemented by a Static Random Access Memory (SRAM), and reading from or writing to the decompression memory may be constrained by SRAM's reading or writing throughput limitations. A cache may be used to mitigate the bottleneck. For example, a cache implemented by D Flip-Flops (DFFs) may improve the throughput.

Figure 4:
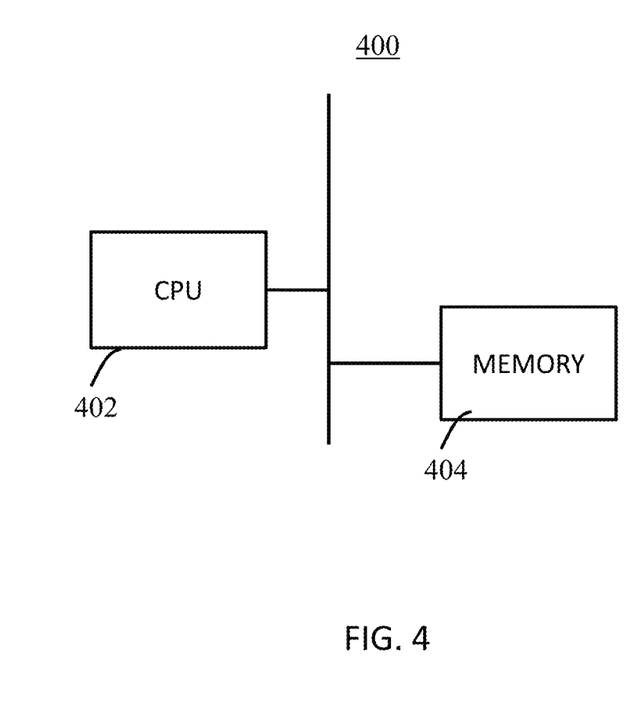
FIG. 4 schematically shows a computing system in accordance with an embodiment of the present disclosure.

In one embodiment, either or both of the encoder 200 and decoder 300 may be implemented in a field-programmable gate array (FPGA), or an application-specific IC (ASIC). In another embodiment, the encoder 200 and decoder 300 may be implemented by a computing system 400 as shown in FIG. 4. The computing system 400 may comprise a computer processor 402 and a memory 404. The memory 404 may comprise executable instructions such that the processor 402 may execute and perform all functions of the encoder 200 and decoder 300.

Figure 5:
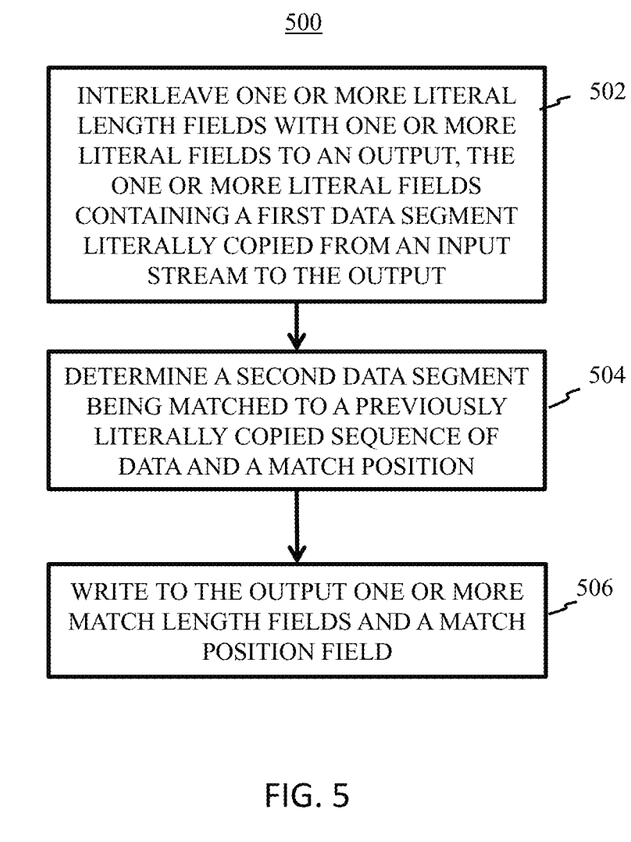
FIG. 5 is a flowchart of compressing a data stream in accordance with an embodiment of the present disclosure.

FIG. 5 shows a process 500 for compressing a data stream in accordance with an embodiment of the present disclosure. One or more compressed data blocks 100 may be generated by the process 500 from an input stream of data. At block 502, one or more literal length fields may be interleaved with one or more literal fields to an output. The one or more literal length fields may contain a first data segment literally copied from an input stream to the output. Each of the one or more literal fields may contain a part of a first data segment literally copied from an input stream of data to the output, and each of the one or more literal length fields may contain a value representing a length of a succeeding literal field. The one or more literal length fields in combination may contain a first total value representing a total length of the first data segment;

At block 504, a second data segment may be determined to match a previously literally copied sequence of data and a match position may be determined. The second data segment may be one matched data snippet with a min-match length or include data merged from a plurality of matched data snippets. At block 506, one or more match length fields and a match position field may be written to the output. The match position field may contain a value representing the match position, and the one or more match length fields in combination may contain a second total value representing a total length of the second data segment.

Figure 6:
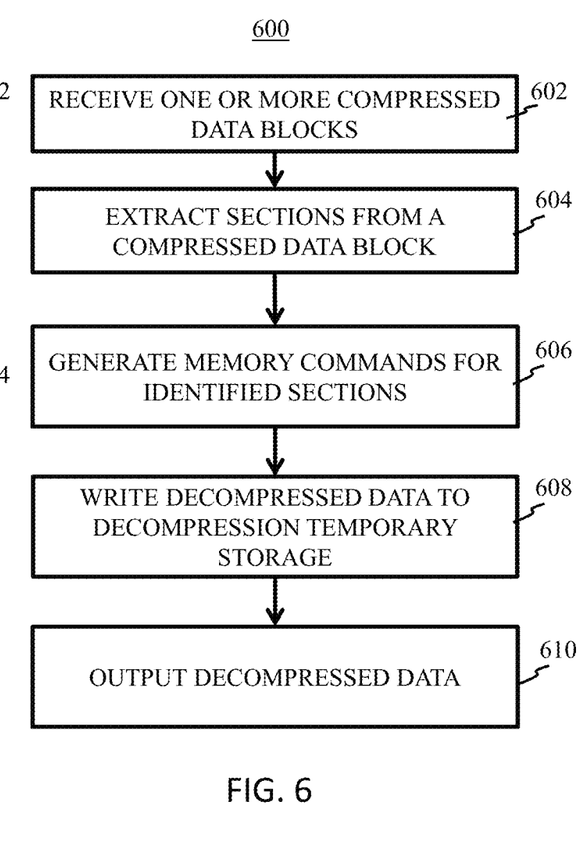
FIG. 6 is a flowchart of decompressing a compressed data stream in accordance with an embodiment of the present disclosure.

FIG. 6 shows a process 600 for decompressing a compressed data stream in accordance with an embodiment of the present disclosure. The compressed data stream may include one or more compressed data blocks 100. At block 602, one or more compressed data blocks may be received. For example, an input buffer may receive the one or more compressed data blocks to be decompressed. At block 604, different sections may be extracted from a compressed data block. For example, the literal section, match section and repeat section may be extracted from a compressed data block 100. At block 606, memory commands may be generated. For example, a write command may be generated to write a literal string in the literal section to a decompression buffer. A read command may be generated to read a matched sequence of bytes with a match length from a match position and send the matched sequence to the decompression buffer. At block 608, decompressed data may be written to an output buffer. At block 610, the decompressed data may be output from the decompressor. For example, the decompressed data may be output to a PCIe bus.

In some embodiments, interleaving the literal length fields and the literal fields may make the encoding process more hardware friendly because there is no need to store a potentially long literal data string in a buffer. Exemplary encoders thus may output literal data snippets as soon as they are processed and the size of the data snippets may be determined by design choice (e.g., throughput requirement or hardware resource). For example, if a long string of data is copied from an input stream to an output stream literally, each data snippets of the long literal string may be output as soon as it is processed. Moreover, in some conventional LZ family compression technique such as LZ4, the first field (e.g., a token) in a compressed data block includes an initial literal length and an initial match length. Such a token mandates that the literally copied data to be buffered and only starting the output process after a first match has been found. In contrast, embodiments of encoders according to the present disclosure may start output literal data right away (as soon as a literal length field reaches its maximum) without waiting for a first match to be found.

Furthermore, most conventional LZ family compression techniques such as LZ4 rely on overlapping match during decoding, in which some portion of the matched data segment is contained in the yet to be decompressed data. Overlapping match makes data time-dependent because the not yet decompressed data is not available to the decoder when a match is found and the decoder has to wait for the data to become available to output decompressed data. Embodiments according to the present disclosure may use the repeat pattern determination, the repeat field and one or more repeat length fields to save the trouble of overlapping match during decoding because the repeated data segment is already decoded and time independent.

In addition, in some embodiments, the match position may be an absolute index in a search window (e.g., 4 KB) and there is no need to calculate the match position based on an offset.

In an exemplary embodiment, there is provided a method for generating compressed data. The method may comprise: interleaving one or more literal length fields with one or more literal fields to an output, each of the one or more literal fields containing a part of a first data segment literally copied from an input stream of data to the output, and each of the one or more literal length fields containing a value representing a length of a succeeding literal field, the one or more literal length fields in combination containing a first total value representing a total length of the first data segment; determining a second data segment of the input stream of data being matched to a previously literally copied sequence of data and a match position; and writing to the output one or more match length fields and a match position field containing a value representing the match position, the one or more match length fields in combination containing a second total value representing a total length of the second data segment.

In an embodiment, the method may further comprise packaging the input stream of data into a plurality of data snippets, calculating a hash value for each of the plurality of data snippets and determining whether each of the plurality of data snippets has a match in previously processed data based on the hash value, respectively. Each data snippet may have a length of a minimum match length, with a first data snippet of the plurality of data snippets starting at a beginning data unit of the input stream of data and each data snippet after the first data snippet starting at a second data unit of a preceding data snippet;

In an embodiment, second data segment may be obtained by merging two or more matched data snippets and the match position may be a position of a first matched data snippets of the two or more matched data snippets.

In an embodiment, the second data segment may be obtained by merging at least two matched data snippets separated by an index difference that is equal to a match position value difference, and the index difference may be the minimum match length or less.

In an embodiment, the method may further comprise keeping track of the previously processed data in a hash table.

In an embodiment, the hash table may be a dictionary with hash values as indices and each entry pointed to by an index may store a data snippet corresponding to the hash value and a position of the data snippet.

In an embodiment, the method may further comprise determining whether there is a repeat pattern; and generating one or more repeat length fields containing a third total value representing a number of repetitions of the repeat pattern.

In an embodiment, the match position may be an absolute index from a beginning of the input stream of data.

In an embodiment, the match position may be an offset from a current position of a data snippet being processed.

In another exemplary embodiment, there is provided an apparatus comprising an encoder. The encoder may comprise a data packager to generate one or more data snippets from an input stream of data, each of the one or more data snippets having a length of a minimum match length; a hash calculator to generate a hash value for each of the one or more data snippets; a hash table to keep track of the one or more data snippets using their respective hash values; a match position searcher to search whether a data snippet has a match in already processed data based on entries in the hash table; a match position merger to merge two or more data snippets having found match in already processed data; and an output assembler. The output assembler may be configured to interleave one or more literal length fields with one or more literal fields to an output, each of the one or more literal fields containing a part of a first data segment literally copied from the input stream of data to the output, and each of the one or more literal length fields containing a value representing a length of a succeeding literal field, the one or more literal length fields in combination containing a first total value representing a total length of the first data segment; determine a second data segment of the input stream of data being matched to a previously literally copied sequence of data and a match position; and write to the output one or more match length fields and a match position field containing a value representing the match position, the one or more match length fields in combination containing a second total value representing a total length of the second data segment.

In an embodiment, a first data snippet of the one or more data snippets may start at a beginning data unit of the input stream of data and each data snippet after the first data snippet may start at a second data unit of a preceding data snippet.

In an embodiment, the second data segment may be obtained by merging two or more matched data snippets and the match position may be a position of a first matched data snippets of the two or more matched data snippets.

In an embodiment, the second data segment may be obtained by merging at least two matched data snippets separated by an index difference that is equal to a match position value difference, and the index difference may be the minimum match length or less.

In an embodiment, the hash table may be a dictionary with hash values as indices and each entry pointed to by an index may store a data snippet corresponding to the hash value and a position of the data snippet.

In an embodiment, the output assembler may be further configured to: determine whether there is a repeat pattern; and generate one or more repeat length fields containing a third total value representing a number of repetitions of the repeat pattern.

In an embodiment, the match position may be an absolute index from a beginning of the input stream of data.

In an embodiment, the match position may be an offset from a current position of a data snippet being processed.

In an embodiment, the apparatus may further comprise a decoder that comprises: a section extractor configured to extract the one or more literal length fields with one or more literal fields as a literal section and extract the one or more match length fields and the match position field as a match section; a decompression buffer to store decompressed data; and a memory command generator to write a literal string obtained from the literal section to the decompression buffer and to read a matched data sequence from the decompression buffer.

In yet another exemplary embodiment, disclosed herein may also include a non-transitory machine-readable medium having executable instructions, wherein the executable instructions, when executed by a computing system, causes the computing system to: interleave one or more literal length fields with one or more literal fields to an output, each of the one or more literal fields containing a part of a first data segment literally copied from an input stream of data to the output, and each of the one or more literal length fields containing a value representing a length of a succeeding literal field, the one or more literal length fields in combination containing a first total value representing a total length of the first data segment; determine a second data segment of the input stream of data being matched to a previously literally copied sequence of data and a match position; and write to the output one or more match length fields and a match position field containing a value representing the match position, the one or more match length fields in combination containing a second total value representing a total length of the second data segment.

In an embodiment, the executable instructions, when executed by the processor, further causes the computing system to: determine whether there is a repeat pattern; and generate one or more repeat length fields containing a third total value representing a number of repetitions of the repeat pattern.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as Dynamic Random Access Memory (DRAM) or Static Random Access Memory (SRAM)), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
packaging an input stream of data into a plurality of data snippets, each data snippet having a length of a minimum match length, with a first data snippet of the plurality of data snippets starting at a beginning data unit of the input stream of data and each data snippet after the first data snippet starting at a second data unit of a preceding data snippet;
determining whether each of the plurality of data snippets has a match in already processed data; and
outputting a stream of compressed data that begins with a literal segment, wherein the literal segment includes one or more literal length fields each followed by a respective succeeding literal field, each of the one or more literal length fields containing a value representing a length of the respective succeeding literal field, wherein the one or more literal fields in combination include data copied from one data snippet of the plurality of data snippets that has no match in the already processed data or from a series of data snippets in succession of the plurality of data snippets that have no match in the already processed data.

2. The method of claim 1, wherein the stream of compressed data further includes a matched segment that includes one or more match length fields and a match position field, and the match position field contains a value representing a match position.

3. The method of claim 2, further comprising obtaining the matched segment by merging two or more matched data snippets, wherein the match position is a position of a first matched data snippets of the two or more matched data snippets.

4. The method of claim 2, further comprising obtaining the matched segment by merging at least two matched data snippets separated by an index difference that is equal to a match position value difference, wherein the index difference is the minimum match length or less.

5. The method of claim 2, wherein the match position is an absolute index from a beginning of the input stream of data.

6. The method of claim 2, wherein the match position is an offset from a current position of a data snippet being processed.

7. The method of claim 1, further comprising calculating a hash value for each of the plurality of data snippets, wherein determining whether each of the plurality of data snippets has a match in the already processed data is based on respective hash values.

8. The method of claim 7, further comprising keeping track of hash values of the already processed data in a hash table.

9. The method of claim 8, wherein the hash table is a dictionary with the hash values as indices and each entry pointed to by an index stores a data snippet corresponding to a respective hash value and a position of the data snippet.

10. The method of claim 1, further comprising:
determining that there is a repeat pattern; and
generating one or more repeat length fields in the stream of compressed data.

11. The method of claim 1, wherein the data copied from the series of data snippets in succession of the plurality of data snippets that have no match in the already processed data does not repeat overlapping data sequence(s).

12. An apparatus, comprising:
an encoder comprising:
a data packager to generate one or more data snippets from an input stream of data, each of the one or more data snippets having a length of a minimum match length, with a first data snippet of the plurality of data snippets starting at a beginning data unit of the input stream of data and each data snippet after the first data snippet starting at a second data unit of a preceding data snippet;
a match position searcher to search whether a data snippet has a match in already processed data; and
an output assembler configured to output a stream of compressed data that begins with a literal segment, wherein the literal segment includes one or more literal length fields each followed by a respective succeeding literal field, each of the one or more literal length fields containing a value representing a length of the respective succeeding literal field, wherein the one or more literal fields in combination include data copied from one data snippet of the plurality of data snippets that has no match in the already processed data or from a series of data snippets in succession of the plurality of data snippets that have no match in the already processed data.

13. The apparatus of claim 12, wherein the stream of compressed data further includes a matched segment that includes one or more match length fields and a match position field, and the match position field contains a value representing a match position.

14. The apparatus of claim 13, wherein the match position is an absolute index from a beginning of the input stream of data.

15. The apparatus of claim 13, wherein the match position is an offset from a current position of a data snippet being processed.

16. The apparatus of claim 12, further comprising a hash calculator to generate a hash value for each of the one or more data snippets, wherein the match position searcher is configured to use the hash value for each of the one or more data snippets to search whether a data snippet has a match in the already processed data.

17. The apparatus of claim 16, further comprising a hash table to keep track of hash values of the already processed data.

18. The apparatus of claim 17, wherein the hash table is a dictionary with the hash values as indices and each entry pointed to by an index stores a data snippet corresponding to a respective hash value and a position of the data snippet.

19. A non-transitory machine-readable medium having executable instructions, wherein the executable instructions, when executed by a processor of a computer system, causes the computing system to:
package an input stream of data into a plurality of data snippets, each data snippet having a length of a minimum match length, with a first data snippet of the plurality of data snippets starting at a beginning data unit of the input stream of data and each data snippet after the first data snippet starting at a second data unit of a preceding data snippet;
determine whether each of the plurality of data snippets has a match in already processed data; and
output a stream of compressed data that begins with a literal segment, wherein the literal segment includes one or more literal length fields each followed by a respective succeeding literal field, each of the one or more literal length fields containing a value representing a length of the respective succeeding literal field, wherein the one or more literal fields in combination include data copied from one data snippet of the plurality of data snippets that has no match in the already processed data or from a series of data snippets in succession of the plurality of data snippets that have no match in the already processed data.

20. The non-transitory machine-readable medium of claim 19, wherein the executable instructions, when executed by the processor, further causes the computing system to:
include a matched segment in the stream of compressed data, wherein the matched segment includes one or more match length fields and a match position field, and the match position field contains a value representing a match position;
determine whether there is a repeat pattern; and
generate one or more repeat length fields.

* * * * *